(12) United States Patent
Suyama

(10) Patent No.: US 7,949,818 B2
(45) Date of Patent: May 24, 2011

(54) MEMORY SYSTEM COMPRISING SEMICONDUCTOR MEMORY HAVING PLURAL DIFFERENT OPERATION MODES

(75) Inventor: Shoji Suyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/548,075

(22) Filed: Oct. 10, 2006

(65) Prior Publication Data

US 2007/0127279 A1 Jun. 7, 2007

(30) Foreign Application Priority Data

Oct. 21, 2005 (JP) ................................. 2005-307024

(51) Int. Cl.
*G06F 12/00* (2006.01)
(52) U.S. Cl. ................................. 711/103; 711/E12.001
(58) Field of Classification Search .................... 711/103
See application file for complete search history.

(56) References Cited

U.S. PATENT DOCUMENTS

| 5,724,592 | A  | * | 3/1998  | Garner ........................... 713/322 |
| 5,850,393 | A  | * | 12/1998 | Adachi .......................... 370/335 |
| 6,026,465 | A  | * | 2/2000  | Mills et al. ..................... 711/103 |
| 6,263,399 | B1 | * | 7/2001  | Hwang .......................... 711/103 |
| 6,449,728 | B1 | * | 9/2002  | Bailey ........................... 713/503 |
| 7,079,445 | B2 | * | 7/2006  | Choi et al. ............... 365/189.02 |
| 7,395,398 | B2 | * | 7/2008  | Kim ............................ 711/167 |
| 2005/0018480 | A1 | | 1/2005 | Choi et al. |
| 2006/0023499 | A1 | | 2/2006 | Ryu |

\* cited by examiner

*Primary Examiner* — Reginald G Bragdon
*Assistant Examiner* — Larry T Mackall
(74) *Attorney, Agent, or Firm* — Oblon, Spivak, McClelland, Maier & Neustadt, L.L.P.

(57) ABSTRACT

A memory system includes a nonvolatile semiconductor memory and a controller. The controller controls the nonvolatile semiconductor memory. The controller selects whether to use the nonvolatile semiconductor memory in a first read mode or in a second read mode having shorter access intervals than the first read mode.

21 Claims, 14 Drawing Sheets

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

| | | |
|---|---|---|
| SD mode 4bit | DAT 3 | CD/DATA |
| | DAT 2 | DATA |
| | DAT 1 | DATA |
| | DAT 0 | DATA |
| | CMD | Command/response |
| | CLK | Clock |
| SD mode 1bit | DAT 3 | Reserved |
| | DAT 2 | Unused |
| | DAT 1 | Unused |
| | DAT 0 | DATA |
| | CMD | Command/response |
| | CLK | Clock |
| SPI mode | DAT 3 | Chip select CS |
| | DAT 2 | Unused |
| | DAT 1 | Unused |
| | DAT 0 | DATA OUT |
| | CMD | DATA IN |
| | CLK | Clock |

FIG. 7

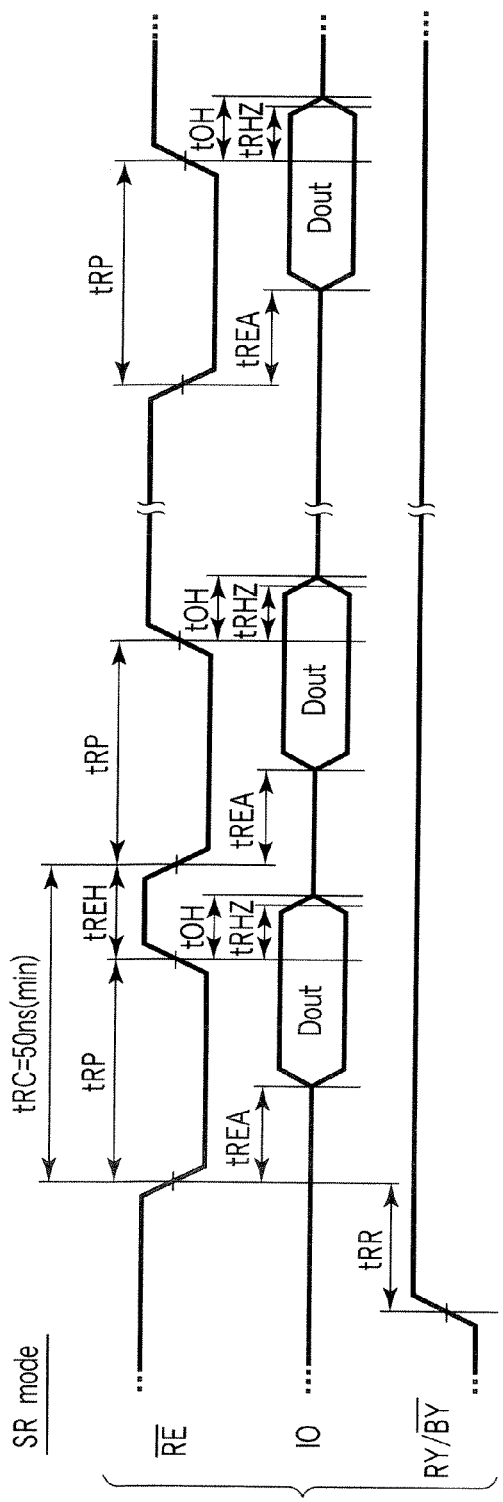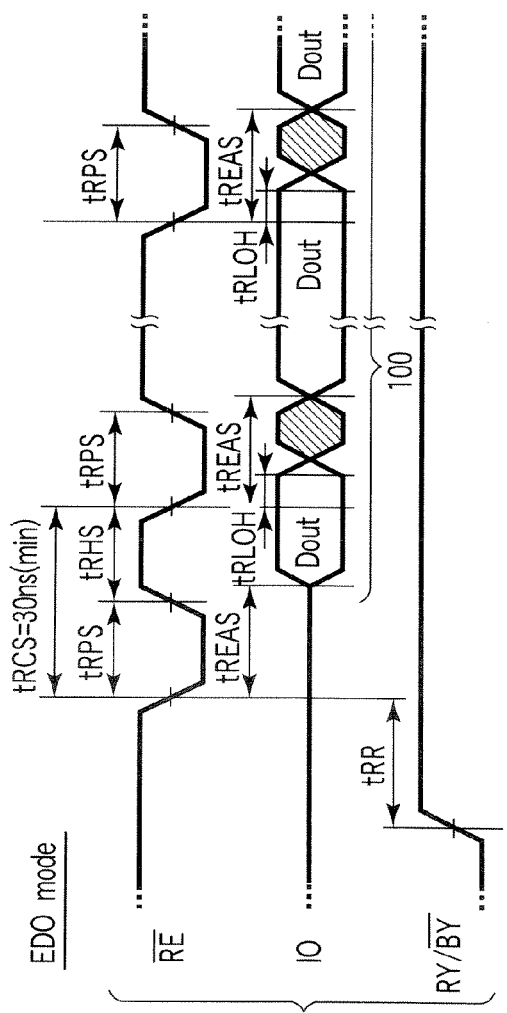
FIG. 8A
FIG. 8B

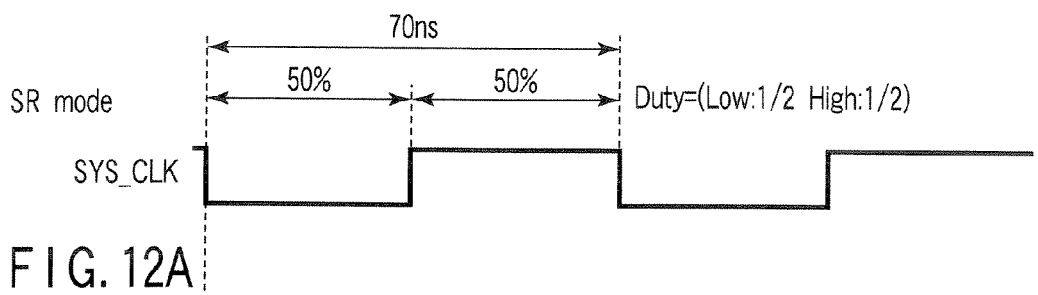
F I G. 12A
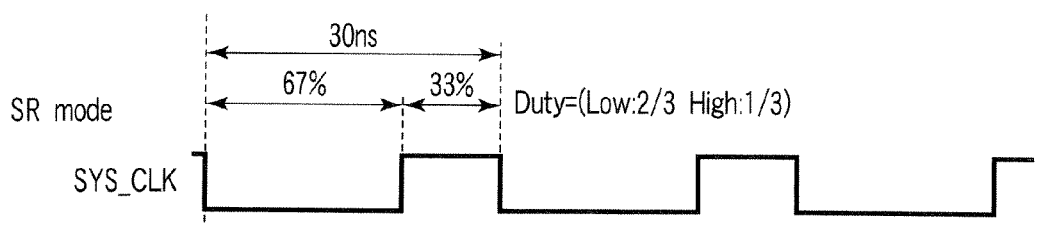
F I G. 12B
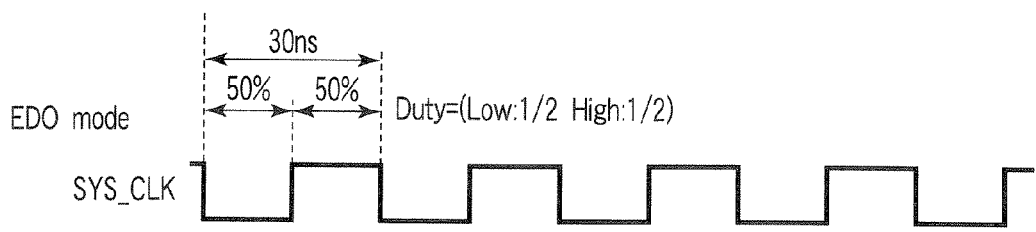
F I G. 12C

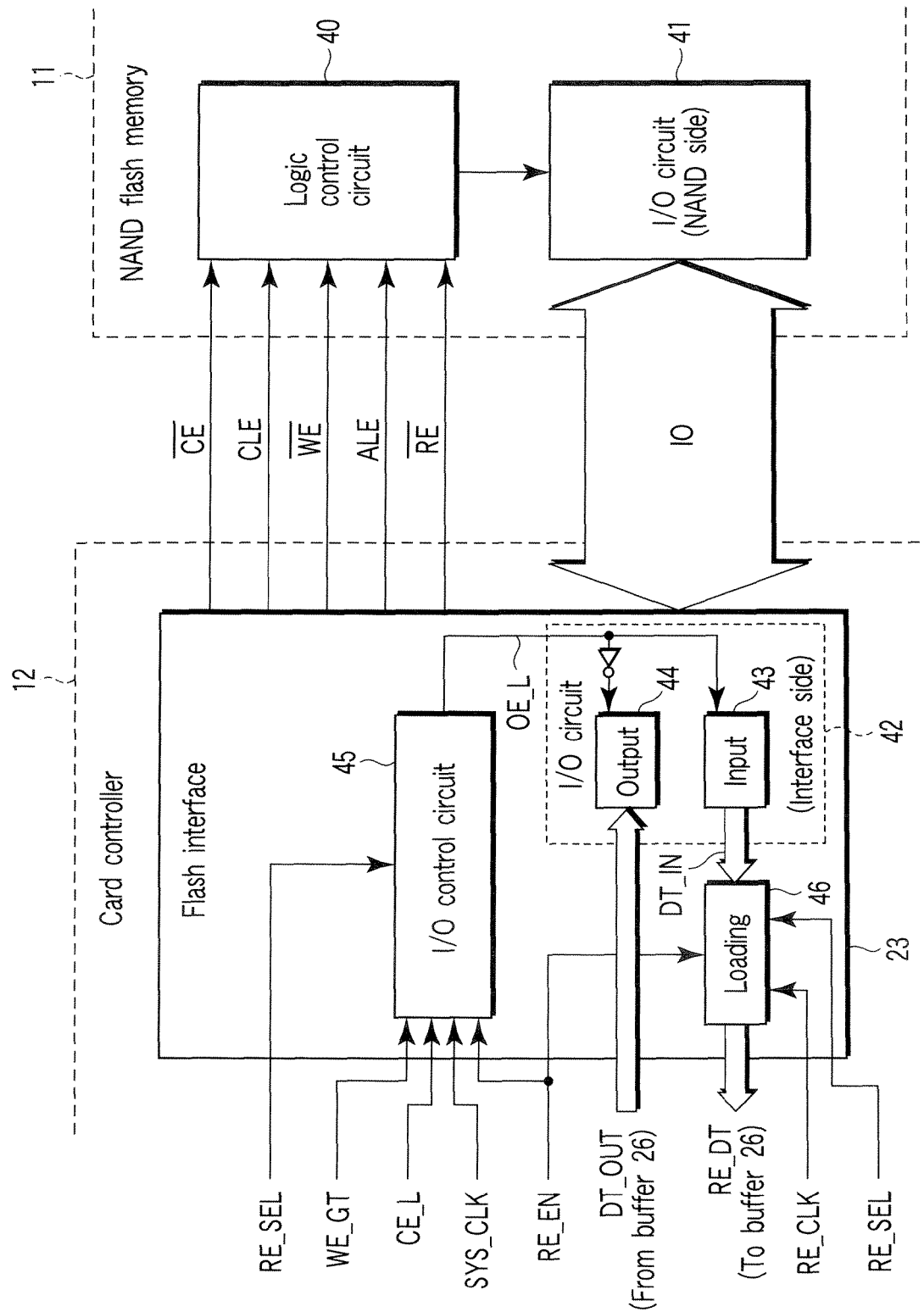
F I G. 13

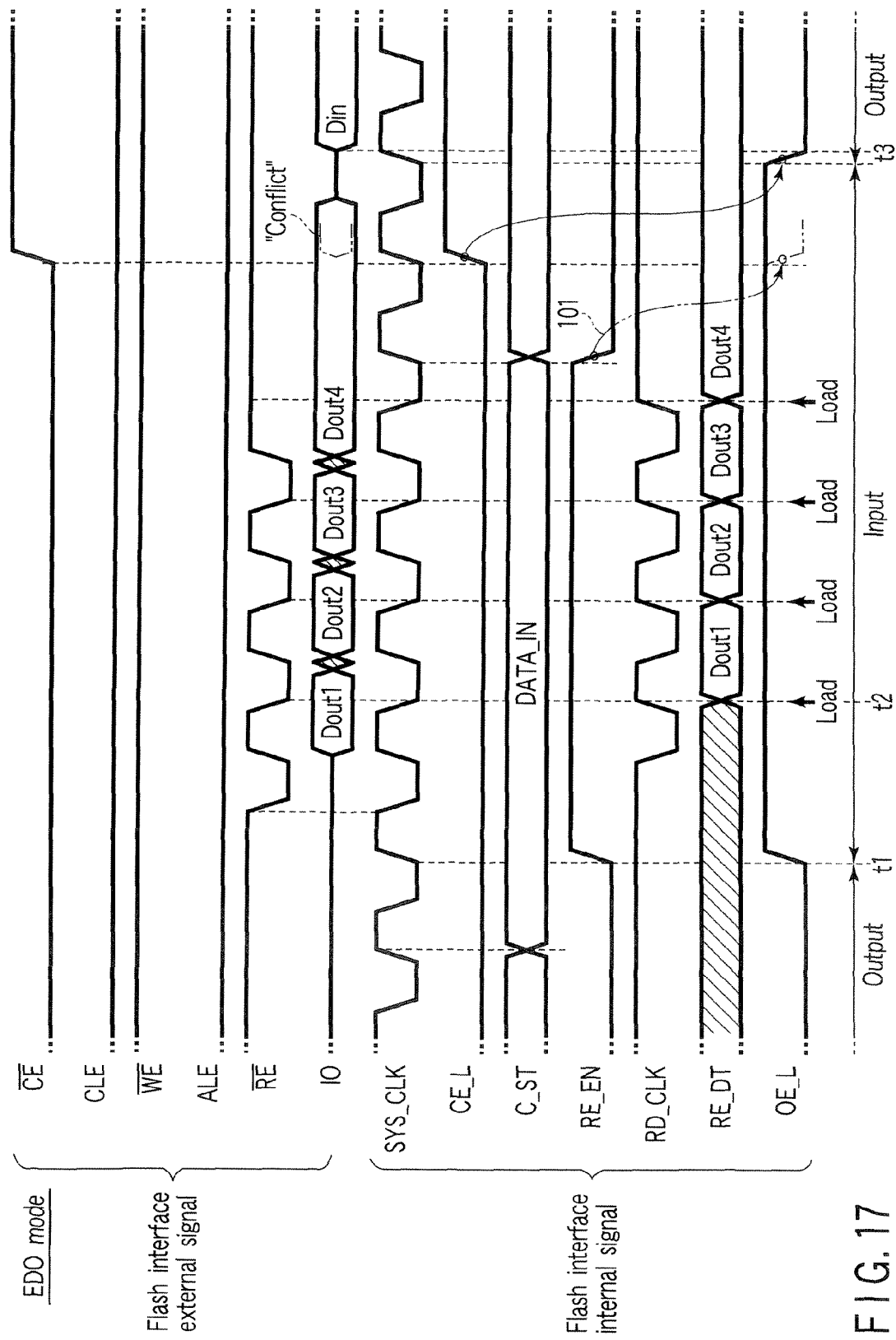
F I G. 17

MEMORY SYSTEM COMPRISING SEMICONDUCTOR MEMORY HAVING PLURAL DIFFERENT OPERATION MODES

CROSS-REFERENCE TO RELATED APPLICATIONS

This application is based upon and claims the benefit of priority from prior Japanese Patent Application No. 2005-307024, filed Oct. 21, 2005, the entire contents of which are incorporated herein by reference.

BACKGROUND OF THE INVENTION

1. Field of the Invention

The present invention relates to a memory system. For example, the present invention relates to a memory system having a nonvolatile semiconductor memory that allows data to be rewritten and a controller that controls the nonvolatile semiconductor memory.

2. Description of the Related Art

Memory cards using nonvolatile semiconductor memories, for example, flash memories, are used as recording media for music data and video data. A typical example of a flash memory for a memory card is a NAND flash memory.

Some memory cards comprise a single card in which a NAND flash memory and a controller that controls the NAND flash memory are mounted. This controller is hereinafter referred to as a card controller (or memory controller). To reduce current consumption, the memory card avoids connecting a pull-up resistor to an I/O line (data line) that connects the card controller and the NAND flash memory together. The card controller controls the I/O line so that data can be written to or read from the NAND flash memory without the need to connect the pull-up resistor to the I/O line. For example, the card controller outputs data to the I/O line for a write operation and allow the I/O line to float for a read operation.

The current NAND flash memory outputs data in a serial read mode. Thus, the card controller controls timings for the I/O line in a manner compatible with the serial read mode.

Some recent host instruments using a memory card as a recording medium require an enormous amount of data to be recorded in the card. Thus, the NAND flash memory has been requested to support a high-speed read mode in which data is read faster than in the serial read mode. In the high-speed read mode, for example, accesses are made to the NAND flash memory at reduced intervals. In this case, the timing control for the I/O line by the card controller is different from that in the serial read mode. This results in the need for many types of memory cards corresponding to the read modes. This situation is inconvenient for users.

BRIEF SUMMARY OF THE INVENTION

A memory system according to a first aspect of the present invention includes:

a nonvolatile semiconductor memory; and a controller which controls the nonvolatile semiconductor memory, the controller selecting whether to use the nonvolatile semiconductor memory in a first read mode or in a second read mode having shorter access intervals than the first read mode.

A recording medium according to a second aspect of the present invention includes:

a nonvolatile semiconductor memory; and a controller which controls the nonvolatile semiconductor memory and which selects whether to use the nonvolatile semiconductor memory in a first read mode or in a second read mode having shorter access intervals than the first read mode.

A memory controller according to a third aspect of the present invention includes:

a host interface configured to be connected to a host instrument; and a memory interface configured to be connected to a semiconductor memory, the memory interface selecting whether to use the semiconductor memory in a first read mode or in a second read mode having shorter access intervals than the first read mode.

BRIEF DESCRIPTION OF THE SEVERAL VIEWS OF THE DRAWING

FIG. 7 is a diagram showing an example of assignment of signals to signal pins in accordance with operation modes;

FIG. 8A is an operation waveform diagram showing an example of operation waveforms in an SR mode, and FIG. 8B is an operation waveform diagram showing an example of operation waveforms in an EDO mode;

FIGS. 12A to 12C are waveform diagrams showing examples of frequency conversions;

FIG. 13 is a diagram showing an example of the connection between a card controller chip and a flash memory chip;

FIG. 17 is an operation waveform diagram showing an example of operation waveforms in the flash interface in the EDO mode;

DETAILED DESCRIPTION OF THE INVENTION

Figures 1, 2:
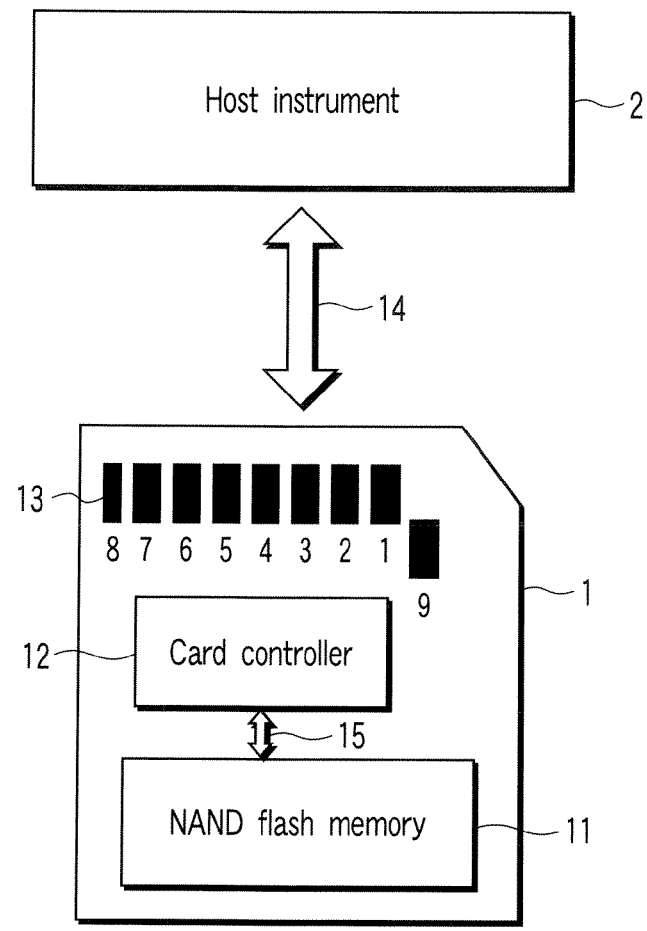
FIG. 1 is a diagram showing an example of a recording medium according to an embodiment of the present invention.
FIG. 2 is a diagram showing an example of assignment of signals to signals pins.

FIG. 1 is a diagram showing an example of a recording medium according to an embodiment of the present invention. In the present example, a memory card using a flash memory is illustrated as a recording medium. Further, in the present example, the illustrated memory card comprises a flash memory and a card controller that controls the flash memory.

As shown in FIG. 1, the memory card 1 transmits and receives information to and from a host instrument via a bus interface 14. The memory card 1 is formed so that it can be inserted into and removed from the host instrument 2 through a slot formed in the host instrument 2.

The memory card 1 comprises a flash memory chip 11, a card controller chip (memory controller chip) 12 that controls the flash memory chip 11, and a plurality of signals pins (first to ninth pins) 13. An example of the flash memory chip 11 is a NAND flash memory. The signal pins 13 are electrically connected to the card controller chip 12 to serve as external pins for the memory card 1. FIG. 2 shows an example of assignment of signals to the first to ninth signal pins 13.

As shown in FIG. 2, data 0 to data 3 are assigned to the seventh, eighth, ninth and first pins, respectively. The first pin is assigned not only to the data 3 but also to a card detection signal. The second pin is assigned to a command, and the third and sixth pins are assigned to ground potential Vss. The fourth pin is assigned to a power supply potential Vdd, and the fifth pin is assigned to a clock signal.

The signal pins 13 and the bus interface 14 are used for the communication between a host controller (not shown) in the host instrument 2 and the memory card 1. For example, the host controller communicates various signals and data to and from the card controller 12 in the memory card 1 via the first pin to the ninth pin. For example, to write data to the memory card 1, the host controller transmits a write command to the controller chip 12 via the second pin. On this occasion, the card controller chip 12 loads the write command, which is provided to the second pin, in response to a clock signal being supplied to the fifth pin. The second pin, assigned to the inputting of a command, is interposed between the first pin for the data 3 and the third pin for the ground potential Vss.

In contrast, the communication between the flash memory chip 11 and the card controller chip 12 is executed via an interface for a NAND flash memory. The interface is, for example, an 8-bit I/O line (data line) 15.

To write data to the flash memory chip 11, the card controller 12 sequentially inputs a data input command 80h, a column address, a page address, the data, and a program command 10h to the flash memory chip 11 via the I/O line 15. Here, "h" in the command 80h denotes a hexadecimal number, and an 8-bit signal "10000000" is provided to the 8-bit I/O line 15 in parallel. In other words, the interface for the NAND flash memory provides a command of plural bits in parallel. Further, with the interface for the NAND flash memory, both the command to the flash memory chip 11 and the data are communicated via the same I/O line 15.

Thus, the interface via which the host controller and the card controller 12 communicate is different from the interface via which the flash memory 11 and the card controller chip 12 communicate.

Figure 3:
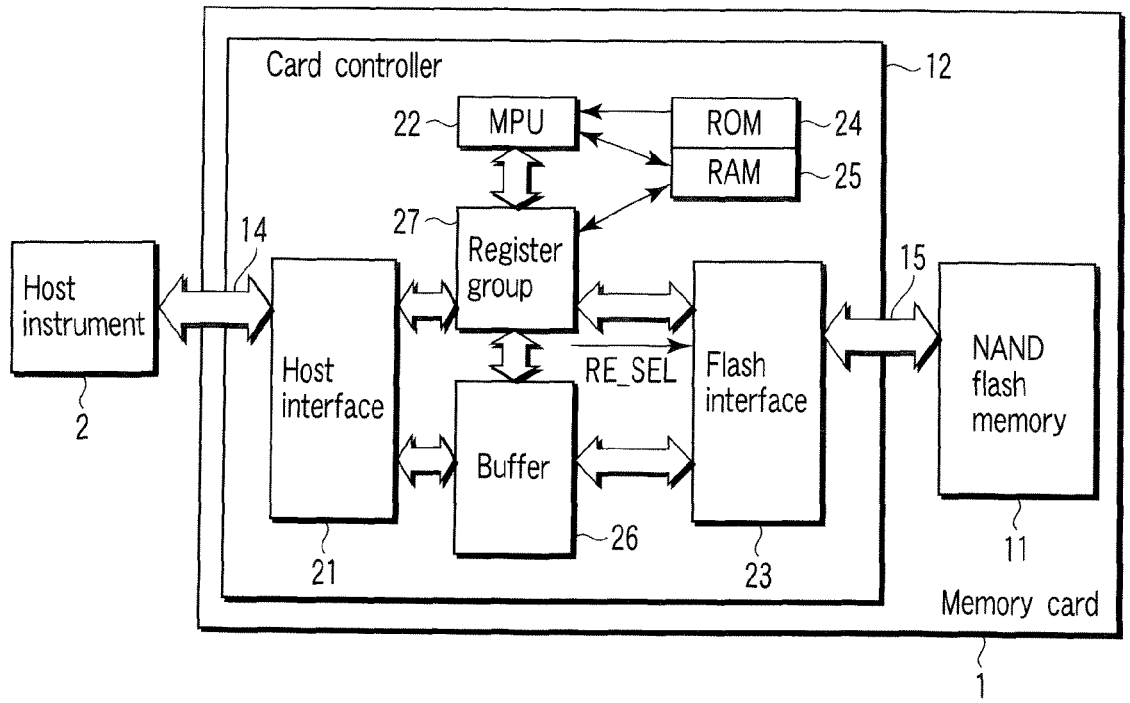
FIG. 3 is a block diagram showing an example of hardware configuration of a memory card according to an embodiment of the present invention.

FIG. 3 is a block diagram showing an example of configuration of a memory card according to an embodiment.

The host instrument 2 comprises hardware and software which are used to access the memory card 1, and software. When connected to the host instrument 2, the memory card 1 is supplied with power to operate and executes a process corresponding to an access from the host instrument 2.

For the flash memory chip 11, an erase block size for erasure (block size per erasure) is specified to have a predetermined value (for example, 256 kB). Data is written to and read from each flash memory chip 11 in units called page (for example, 2 kB).

The card controller chip 12 manages the internal physical state of the flash memory chip 11 (for example, the identification of the appropriate physical block address, the ordinal number of logical sector address data placed at that physical block address, or blocks in an erased state). The card controller chip 12 includes a host interface 21, micro processing unit (MPU) 22, a flash interface 23, read-only memory (ROM) 24, random access memory (RAM) 25, a buffer 26, and a register group 27.

The host interface 21 executes an interface process between the card controller chip 12 and the host instrument 2.

Figure 4:
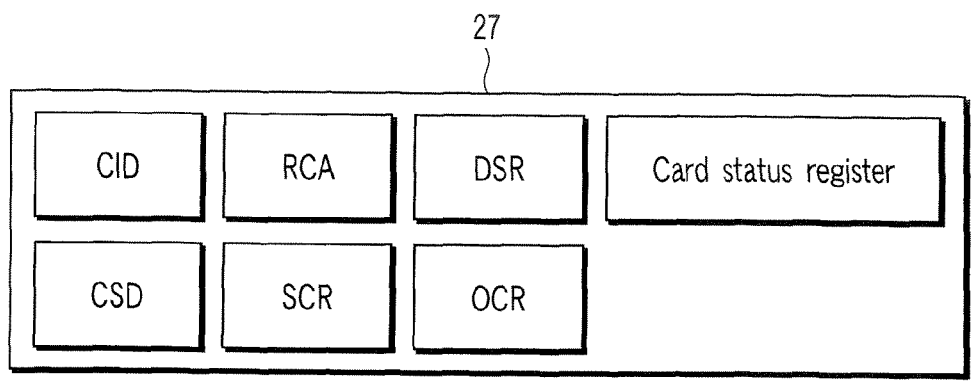
FIG. 4 is a diagram showing an example of a register group shown in FIG. 3.

The register group 27 has various registers. FIG. 4 shows an example of configuration of the register group 27.

As shown in FIG. 4, the register group 27 includes a card status register and CID, RCA, DSR, CSD, SCR, and OCR. These registers are defined as described below.

The card status register is used for normal operations and stores, for example, error information.

CID, RCA, DSR, CSD, SCR, and OCR are mainly used to initialize a memory card.

The individual number of the memory card 1 is stored in CID (Card Identification Number). A relative card address is stored in RCA (Relative Card Address). The relative card address is determined by the host instrument 2 during initialization. A bus drive capability and the like for the memory card 1 are stored in DSR (Drive Stage Register). Specific parameters for the memory card 1 are stored in CSD (Card Specific Data). The specific parameters include, for example, version information, a performance identification code, and performance parameters. The data arrangement in the memory card 1 is stored in SCR (SD Configuration data Register). An operation voltage is stored in OCR (Operation Condition Register) if the memory card is limited in operation range voltage.

MPU 22 controls the operation of the whole memory card 1. For example, when the memory card 1 is supplied with power, MPU 22 reads firmware stored in ROM 24, into RAM 25. MPU 22 then executes a predetermined process to create various tables on RAM 25.

MPU 22 also receives a write command, a read command, and an erase command from the host instrument 2. MPU 22 then executes a predetermined process on the flash memory chip 11 or controls a data transfer process through a buffer 26.

ROM 24 stores, for example, control programs that are controlled by MPU 22. RAM 25 is used as a work area for MPU 22 to store control programs and various tables. The flash controller 23 executes an interface process between the card controller chip 12 and the flash memory chip 11.

Figure 5:
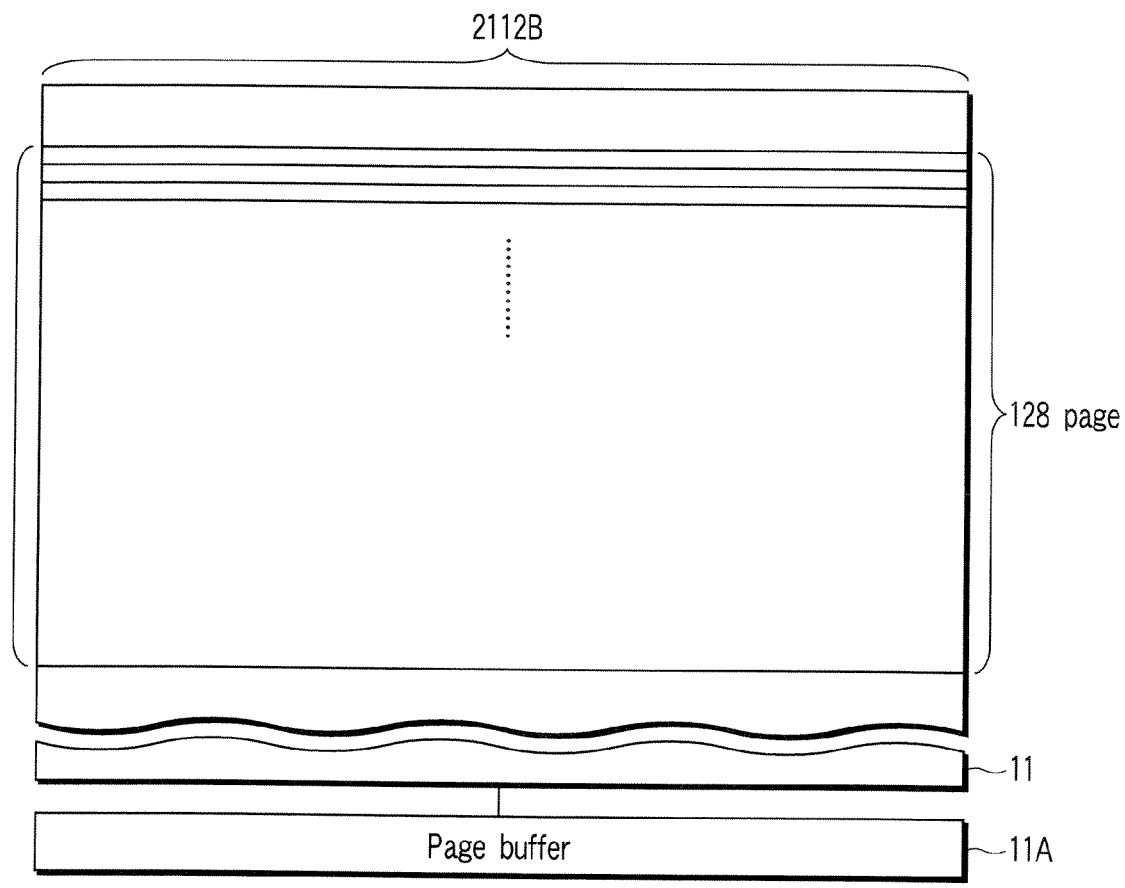
FIG. 5 is a diagram showing an example of data arrangement in a flash memory chip.

The buffer 26 temporarily stores a given amount of data (for example, one page of data) when data sent by the host instrument 2 is written to the flash memory chip 11. The buffer 26 also temporarily stores a given amount of data when data read from the flash memory chip 11 is sent out to the host instrument 2. FIG. 5 shows an example of the data arrangement in the flash memory chip 11.

As shown in FIG. 5, each page in the flash memory chip 11 has, for example, 2112 B (512 B of data storage section×4+10 B of redundant section×4+24 B of management data storage section). For example, 128 pages corresponds to an erase unit (256 kB+8 kB (here, k is 1024)). Each erase unit is called a block. If the flash memory chip 11 has a storage capacity of, for example, 1 Gbits, the number of 256-kB blocks (erase units) is 512. FIG. 5 shows the case in which the block has a storage capacity of 256 kB. However, it is also effective in a practical sense that the block has a storage capacity of, for example, 16 kB. In this case, each page has 528 B (512 B of data storage section+16B of redundant section), and 32 pages corresponds to an erase unit (16 kB+0.5 kB).

Figure 6:
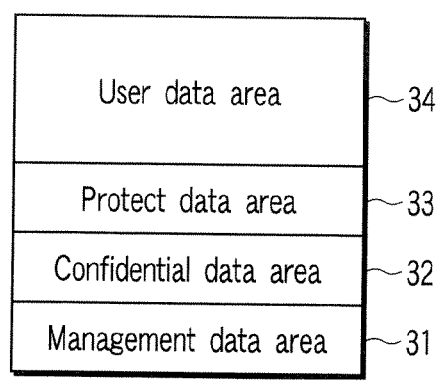
FIG. 6 is a diagram showing an example of a data storage area in the flash memory chip.

The flash memory chip 11 comprises a page buffer 11A to which data from the flash memory chip 11 is input and which outputs data to the flash memory chip 11. An example of storage capacity of the page buffer 11A is 2112 B (2048 B+64 B). For a data write operation, the page buffer 11A executes data input and output processes on the flash memory chip 11 in page corresponding to the storage capacity of the page buffer 11A. FIG. 6 shows an example of a data storage area in the flash memory chip 11.

As shown in FIG. 6, an area (data storage area) in the flash memory chip 11 in which data is written is divided into plural areas in accordance with saved data. The data storage area in the flash memory 11 comprises, for example, a management data area 31, a confidential data area 32, a protect data area 33, and a user data area 34.

Management information on a memory card is mainly stored in the management data area 31. For example, security information on the memory card 1 and card information such as a media ID are stored in the management data area 31.

Key information used for encryption and confidential data used for authentication are stored in the confidential data area 32. For example, the host instrument 2 cannot access the confidential data area 32.

Important data is stored in the protect data area 33. The protect data area 33 can be accessed only if for example, the host instrument 2 connected to the memory card 1 has been proved to be valid through the authentication between the memory card 1 and the host instrument 2.

User data is stored in the user data area 34. A user using the memory card 1 is free to access and use the user data area 34.

The memory card 1 according to the present example includes, for example, an SD mode and an SPI mode as operation modes. The SD mode is further divided into, for example, an SD4 bit mode and SD1bit mode. FIG. 7 shows an example of assignment of signals to signal pins in accordance with the operation modes.

As shown in FIG. 7, in the SD mode, the memory card 1 is set in the SD4 bit mode or the SD1bit mode in response to a bus width change command from the host instrument 2.

Here, four data pins, a data 0 pin (DAT0) to a data 3 pin (DAT3) are noted. In the SD4 bit mode, in which data is transferred using a 4-bit width, all of the four data pins, the data 0 pin to the data 3 pin, are used for data transfers.

In the SD1bit mode, in which data is transferred using a 1-bit width, only the data 0 pin (DAT0) is used for data transfers. The data 1 pin (DAT1) and the data 2 pin (DAT2) are not used. The data 3 pin (DAT3) is used for, for example, an asynchronous interrupt to the host instrument 2 by the memory card 19.

In the SPI mode, the data 0 Pin (DAT0) is used for a data signal line (DATA OUT) through which data is transmitted from the memory card 1 to the host instrument 2. The command pin (CMD) is used for a data signal line (DATA IN) from the host instrument 2 to the memory card 19. The data 1 pin (DAT1) and the data 2 pin (DAT2) are not used. In the SPI mode, the data 3 pin (DAT3) is used to transmit a chip select signal CS from the host instrument 2 to the memory card 1.

The host instrument 2 has a file system. The file system is a scheme for managing files (data) recorded in the memory and indicates the management area provided in the area and management information. The following are specified for the file system: a method for creating directory information on files, folders, and the like in the memory, a method for moving or removing the files or folders, a data recording scheme, the location and usage of the management area, and the like.

The present embodiment further includes the arrangements described below.

The card controller 12, shown in FIG. 3, selects whether to uses the flash memory chip 11 in a first read mode or in a second read mode having shorter access intervals than the first read mode. Then, in the present example, the flash interface 23 of the card controller 12 changes, for example, timing control for the I/O line in a manner compatible with the first read mode or the second read mode. Then, the flash interface 23 changes the timing control to match the first or second read mode depending on the selected read mode. This change is determined in accordance with a read mode switching signal RE_SEL.

An example of the first read mode is a serial read mode (hereinafter simply referred to as an SR mode). The second read mode has shorter access intervals than the first read mode. An example of a read mode with shorter access intervals is a read mode with a shorter read cycle time tRC. An example of a read mode with a shorter read cycle time tRC is an extended data out mode (hereinafter referred to as an EDO mode) if the first read mode is the SR mode. FIG. 8A shows an example of operation waveforms in the SR mode. FIG. 8B shows an example of operation waveforms in the EDO mode. FIGS. 8A and 8B show only a read enable signal/RE, an I/O line IO, and a ready busy signal RY//BY.

As shown in FIGS. 8A and 8B, a read cycle time tRCS in the EDO mode may be shorter than the read cycle time tRC in the SR mode. Consequently, the EDO mode may have shorter access intervals than the SR mode. An example of the read cycle time tRCS in the EDO mode is 30 ns (minimum) under operation conditions including, for example, a temperature of 0 to 70° C. and a power supply voltage of 2.7 to 3.6 V. In contrast, an example of the read cycle time tRC in the SR mode is 50 ns (minimum) under the same operation conditions.

Since the read cycle time tRCS may be shorter than the read cycle time tRC, a read enable access time tREAS, a read pulse width tRPS, and a read enable "high" level holding time tRHS are as described below. These parameters in the SR mode are compared with those in the EDO mode below. The operation conditions are as described above.

Read Cycle Time
SR mode: tREA=35 ns (maximum); the load is 100 pF.
EDO mode: tRES=25 ns (maximum); the load is 50 pF.
Read Pulse Width
SR mode: tRP=35 ns (minimum)
EDO mode: tRPS=15 ns (minimum)
Read Enable "High" Level Holding Time
SR mode: tREH=15 ns (minimum)
EDO mode: tRHS=15 ns (minimum)

Data output holding times tRLOH and tOH are as described below. The operation conditions are as described above.

Data Output Holding Time
SR mode: tOH=10 ns (minimum)
EDO mode: tRLOH=5 ns (minimum)

The amount of time tRP from when the signal RY//BY gets ready until the read enable signal/RE falls may be, for example, the same for both the SR mode and the EDO mode. For example, under the above conditions, the time tRP is 20 ns (minimum).

Figure 9A:
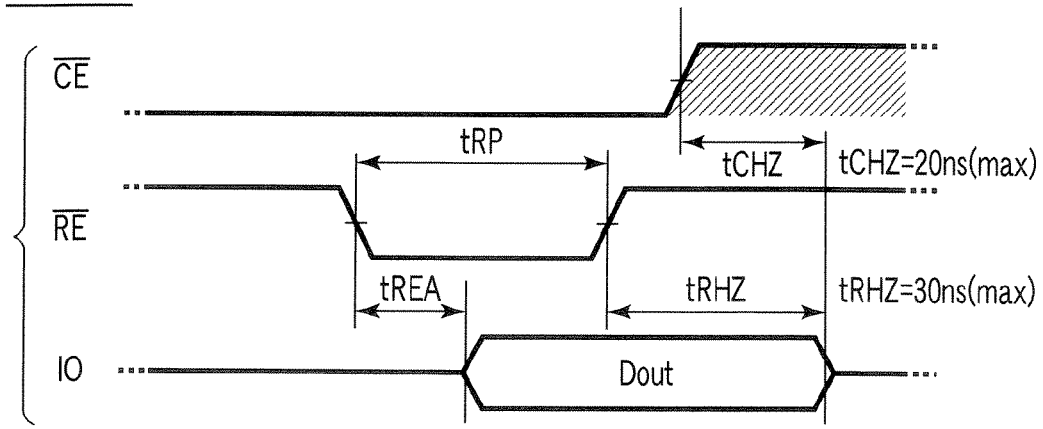
FIG. 9A is an operation waveform diagram showing an example of operation waveforms in the SR mode.

In the SR mode, when the read enable signal/RE rises after data output, the I/O line is set to a high impedance state. The amount of time tRHZ from the rising edge of the signal/RE until the I/O line is set to the high impedance state is, for example, 30 ns (maximum) under the above operation conditions. Further, in the SR mode, the I/O line is also set to the high impedance state if an SR chip enable signal/CE rises. The amount of time tCHZ from the rising edge of the signal/CE until the I/O line is set to the high impedance state is, for example, 20 ns (maximum) under the above operation conditions. FIG. 9A shows an example of corresponding operation waveforms.

In contrast, in the EDO mode, after data output, the I/O line is not set to the high impedance state even though the read enable signal/RE rises. In the EDO mode, as shown at reference numeral 100 in FIG. 8, data remains held during a read operation until the read enable signal/RE falls. In the EDO mode, the I/O line is set to the high impedance state when:
(1) a command latch enable signal CLE rises,
(2) a write enable signal/WE falls,
(3) an address latch enable signal ALE rises, or
(4) a chip enable signal/CE rises.

Figure 9B:
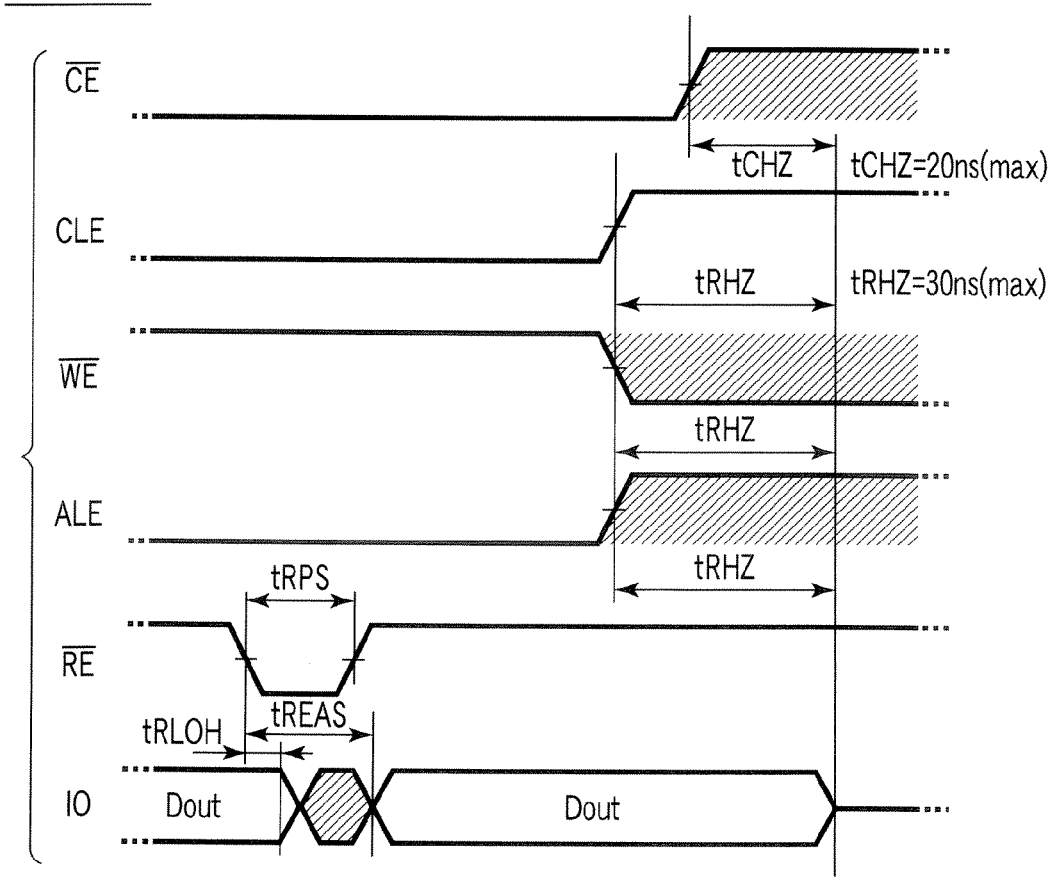
FIG. 9B is an operation waveform diagram showing an example of operation waveforms in the EDO mode.

In the EDO mode, the following is defined as a time tRHZ: the amount of time from the rising edge of the signal CLE until the I/O line is set to the high impedance state, the amount of time from the falling edge of the signal/WE until the I/O line is set to the high impedance state, or the amount of time from the rising edge of the signal ALE until the I/O line is set to the high impedance state. The time tRHZ in the EDO mode is, for example, 30 ns (maximum) under the above operation conditions. Also in the EDO mode, if the chip enable signal/CE rises, the I/O line is set to the high impedance state. The amount of time tCHZ from the rising edge of the signal/CE until the I/O line is set to the high impedance state is, for example, 20 ns (maximum) under the above operation conditions. FIG. 9B shows an example of corresponding operation waveforms.

Figure 10:
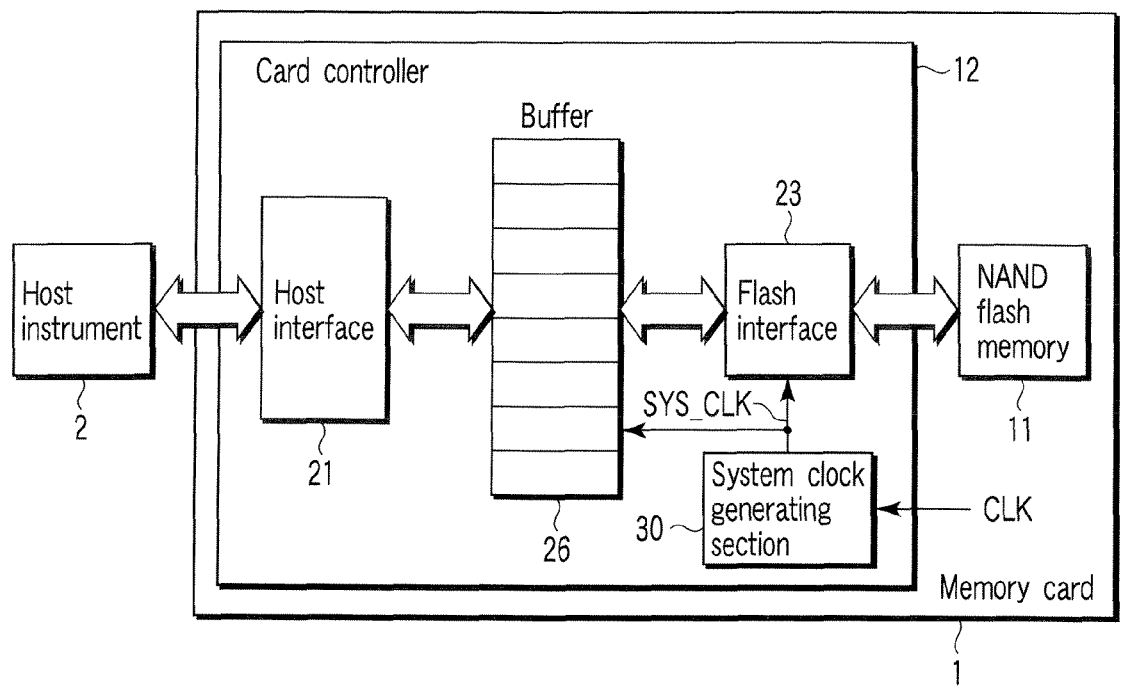
FIG. 10 is a block diagram showing an example of configuration used if the frequency a system clock is converted inside a card controller.

As described above, the read cycle time tRC and the read cycle time tRCS in the EDO mode may vary between the first read mode and the second read mode, in the present example, between the SR mode and the EDO mode. In this case, the frequency of a system clock used in the card controller must be changed depending on the read mode. For a change in the frequency of the system clock, the frequency of an external clock itself which is provided to the card controller 12 may be varied between the SR mode and the EDO mode. However, in the present example, the card controller 12 internally converts the frequency of the system clock. Thus, in the present example, the card controller chip 12 can deal with both the SR mode and the EDO mode. FIG. 10 shows an example of a configuration in which the card controller 12 internally converts the frequency of the system clock. In FIG. 10, the MPU 22, ROM 24, RAM 25, and register group 27, shown in FIG. 3, are omitted.

As shown in FIG. 10, the card controller 12 according to the present example has a system clock generating section 30.

Figure 11:
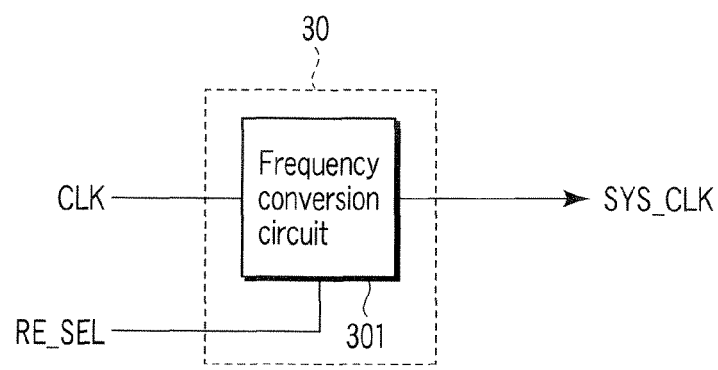
FIG. 11 is a block diagram showing an example of a frequency conversion circuit.

The system clock generating section 30 in the present example receives an external clock CLK to generate a system clock SYS_CLK. The system clock SYS_CLK is used to measure and determine control timings for the card controller chip 12. The system clock generating section 30 in the present example changes the frequency of the system clock SYS_CLK in accordance with the determined read mode. To achieve this, the system clock generating section 30 in the present example includes a frequency converting circuit. FIG. 11 shows an example of a frequency converting circuit.

As shown in FIG. 11, the frequency converting circuit 301 converts the frequency of the external clock CLK in accordance with the read mode switching signal RE_SEL to output the system clock SYS_CLK. In the present example, when the read mode switching signal RE_SEL is "0", the frequency of the system clock SYS_CLK is converted so as to be compatible with the SR mode. When the read mode switching signal RE_SEL is "1", the frequency of the system clock SYS_CLK is converted so as to be compatible with the EDO mode. An example of the frequency converting circuit 301 is a PLL (Phase Locked Loop) circuit. An oscillation source for the external clock CLK may be a CR oscillation circuit, an oscillator, or a crystal oscillator. FIGS. 12A to 12C show examples of frequency conversions.

FIGS. 12A and 12B show examples in the SR mode. In the example shown in FIG. 12A, one cycle=70 ns and the duty is "Low=½ and High=½". In the example shown in FIG. 12B, one cycle=50 ns and the duty is "Low=⅔ and High=⅓". Both examples can support the SR mode. The duty is the ratio of the period during which the signal is at a "high" level to one period.

FIG. 12C shows an example in the EDO mode. In the example shown in FIG. 12C, one cycle=30 ns and the duty is "Low=½ and High=½". This example can support the EDO mode.

In the present example, the system clock generating section 30 changes the frequency of the system clock SYS_CLK in accordance with the determined read mode. Thus, even if the read cycle time tRC in the first read mode (in the present example, the SR mode) is different from the read cycle time tRCS in the second read mode (in the present example, the EDO mode), the card controller 12 can support both the first read mode and the second read mode.

Moreover, the timing control for the I/O line may vary between the first read mode and the second read mode, in the present example, the SR mode and the EDO mode.

For example, the following timings may vary between these modes: the timing at which read data output to the I/O line 15 by the flash memory chip 11 during a read operation is loaded into the buffer 26 in the card controller 12, and the timing at which the I/O line 15 is activated or set to the high impedance state.

In the present example, the card controller 12 varies timing control for the I/O line 15 between the first read mode and the second read mode. FIG. 13 shows an example of the connection between the card controller chip 12 and the NAND flash memory chip 11.

As shown in FIG. 13, the card controller chip 12 is connected to the flash memory chip 11 via the flash interface 23.

The flash interface 23 provides various control signals to the flash memory chip 11 and transmits data to and from the flash memory chip 11 via the I/O line 15. FIG. 13 show some control signals, the chip enable signal/CE, the command latch enable signal CLE, the write enable signal/RE, the address latch enable signal ALE, and the read enable signal/RE. These control signals are output by, for example, the flash interface 23 and input to, for example, a logic control circuit 40 in the flash memory chip 11. The logic control circuit 40 controls the flash memory chip 11 in accordance with the input control signal. A NAND side I/O circuit 41 in the flash memory chip 11 is connected via the I/O line 15 to an interface side I/O circuit 42 provided inside the flash interface 23. The interface side I/O circuit 42 includes an input circuit 43 and an output circuit 44. The input circuit 43 and the output circuit 44 are connected to the I/O line 15 and controlled by an I/O control circuit 45.

Figure 14:
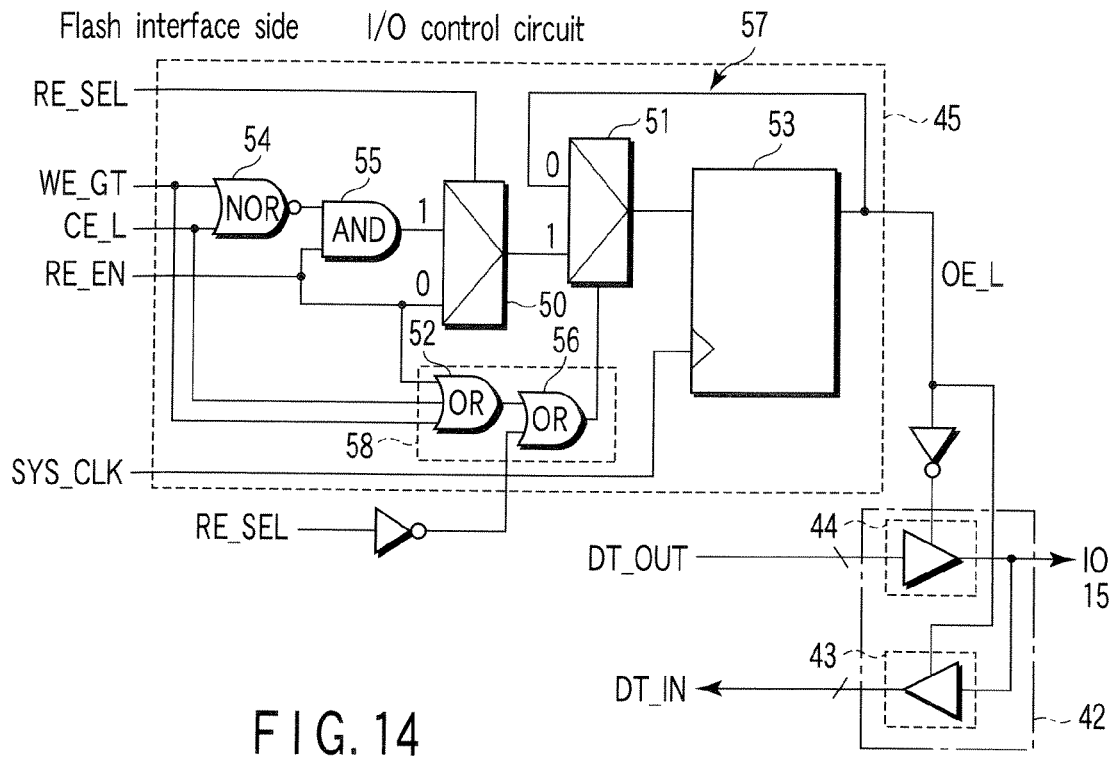
FIG. 14 is a circuit diagram showing an example of circuit configuration of an I/O control circuit.

The I/O control circuit 45 in the present example is provided inside the flash interface 23. The I/O control circuit 45 in the present example outputs an output enable signal OE_L in accordance with the read mode switching signal RE_SEL, an enable signal WE_GT for a write access, a controller internal signal (internal chip enable signal) CE_L for the chip enable signal/CE, the system clock SYS_CLK, and a controller internal signal (internal read enable signal) RE_EN for the read enable signal/RE. In the present example, the output enable signal OE_L controls the input circuit 43 and the output circuit 44. The I/O control circuit 45 controls the input circuit 43 and the output circuit 44 to control the timings at which the I/O line 15 is activated or set to the high impedance state. FIG. 14 shows an example of circuit configuration of the I/O control circuit 45. The operation of the I/O control circuit 45 will be described later.

Figure 15:
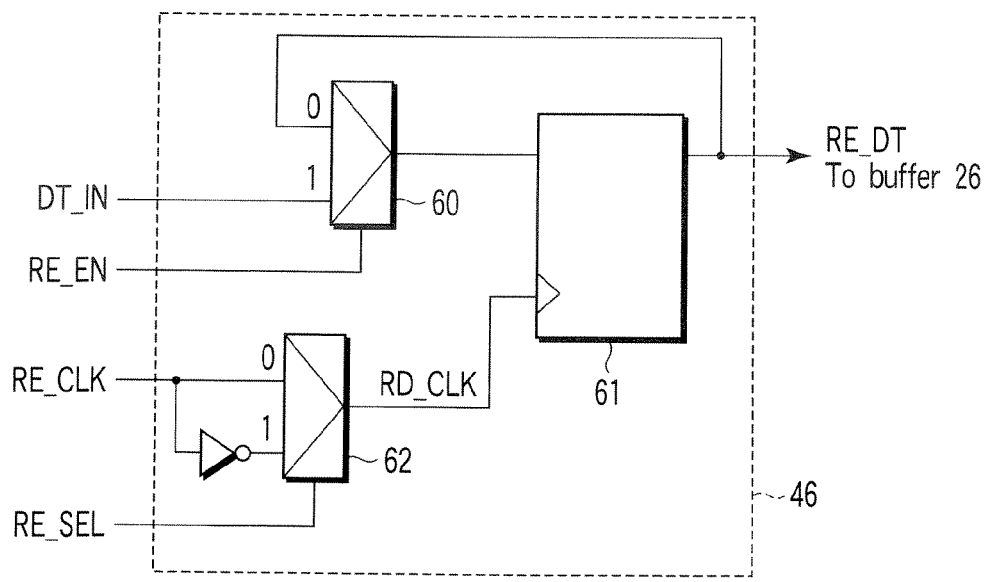
FIG. 15 is a circuit diagram showing an example of circuit configuration of a data loading circuit.

As shown in FIG. 13, the flash interface 23 further has a data loading circuit 46. The data loading circuit 46 controls the timing at which data input to the input circuit 43, that is, read data DT_IN output by the flash memory chip 11, is output to the buffer 26. The data loading circuit 46 in the present example controls the timing at which the read data DT_IN is output to the buffer 26 in accordance with the internal read enable signal RE_EN, a clock signal RE_CLK that determines the timing for data loading, and the read mode switching signal RE_SEL. In other words, the data loading circuit 46 controls the timing at which read data output to the I/O line 15 by the flash memory chip 11 is loaded into the buffer 26 in the card controller 12. Data RE_DT output by the data loading circuit 46 is output to the buffer 26. FIG. 15 shows an example of the data loading circuit 46.

Now, description will be given of example of the operation of the flash interface 23 in the present example.

Figure 16:
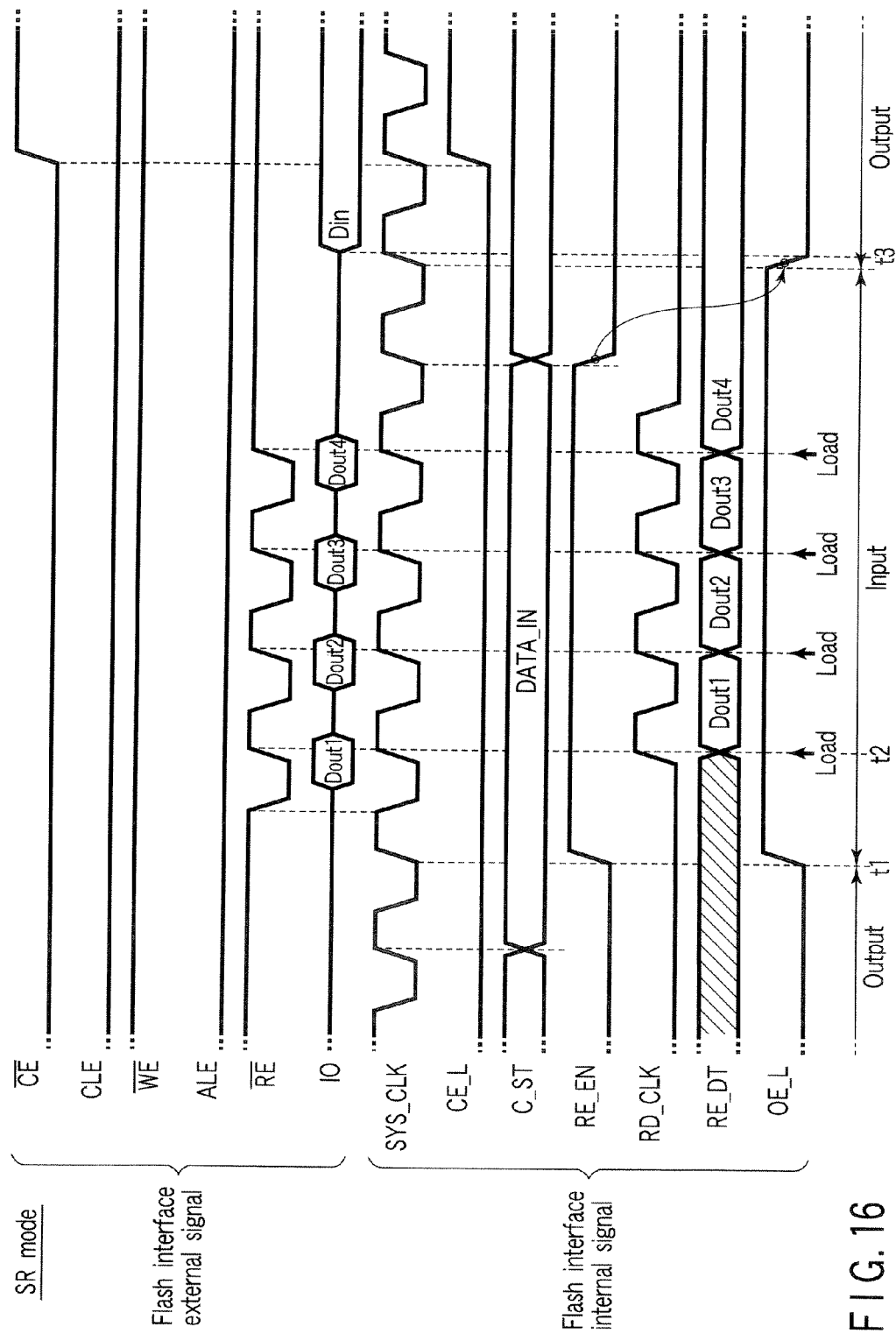
FIG. 16 is an operation waveform diagram showing an example of operation waveforms in a flash interface in the SR mode.

FIG. 16 is an operation waveform diagram showing an example of operation waveforms in the flash interface 23 in the SR mode. FIG. 17 is an operation waveform diagram showing an example of operation waveforms in the flash interface 23 in the EDO mode.

(SR Mode)

A data read operation in accordance with the SR mode is started when the read enable signal/RE falls while a state signal C_ST is in a "DATA_IN" state. Then, in the present example, the SR mode is asserted when the read mode switching signal RE_SEL is "0 (=Low)".

As shown in FIG. 16, when the state signal C_ST is brought into the "DATA_IN" state, the signal RE_EN changes from "0 (=Low)" to "1 (=High)" (time t1). The read enable signal/RE subsequently changes from "1 (=High)" to "0 (=Low)". The flash memory chip 11 outputs data Dout 1 to the I/O line 15. On this occasion, the interface side I/O control circuit 45, shown in FIG. 14, operates as described below.

The mode switching signal RE_SEL is "0". A selector 50 in the I/O control circuit 45 selects a 0 input in accordance with the signal RE_SEL. The selection of the 0 input allows the signal RE_EN to be output to a selector 51. The selector 51 selects a 0 input or a 1 input in accordance with an output from an OR gate circuit 56. The OR gate circuit 56 receives an output from the OR gate circuit 52 and the inverted signal RE_SEL. Since the signal RE_SEL is "0", the inverted signal is "1". Consequently, the OR gate circuit 56 outputs "1" regardless of the output from the OR gate circuit 52. Since the output from the OR gate circuit 56 is "1", the selector 51 continues to select a 1 input during the SR mode.

Since the selector 51 selects the 1 input, the signal RE_EN is input to a flip flop circuit 53. The flip flop circuit 53 outputs the input signal in response to the rising edge of the system clock SYS_CLK. The output from the flip flop circuit 53 is the output enable signal OE_L, which becomes "1 (=High)". Since the signal OE_L becomes "1", the I/O control circuit 45 enables the input circuit 43, while disabling the output circuit 44 (time t2).

Thus, in the SR mode, the I/O control circuit 45 enables the input circuit 43 in response to a change in the signal RE_EN from "0" to "1". This brings the I/O circuit 42 into an "input" mode.

Since the I/O circuit 42 is brought into the "input" mode, the data Dout1 output to the I/O line 15 is input to the data loading circuit 46 via the input circuit 43 as data DT_IN. On this occasion, the data loading circuit 46, shown in FIG. 15, operates as described below.

A selector 60 in the data loading circuit 46 selects a 1 input in accordance with the signal RE_EN. The selection of the 1 input allows the data DT_IN to be input to a flip flop circuit 61.

A selector 62 selects a 0 input in accordance with the signal RE_SEL. The selection of the 0 input allows the clock signal RE_CLK to be input to the flip flop circuit 61 as a clock signal RD_CLK. The flip flop circuit 61 outputs the input data DT_IN as data RE_DT in accordance with the rising edge of the clock signal RD_CLK. The flip flop circuit 61 subsequently outputs the input data DT_IN as data RE_DT every time the clock signal RD_CLK rises.

In the SR mode, as shown in FIG. 16, the clock signal RD_CLK rises in synchronism with the rising edge of the system clock SYS_CLK. Moreover, in the present example, the read enable signal/RE rises in synchronism with the rising edge of the system clock SYS_CLK. Consequently, in the SR mode, the data DT_IN is loaded into the buffer 26 in synchronism with the rising edge of the system clock SYS_CLK, the rising edge of the read enable signal/RE, or the rising edges of both system clock SYS_CLK and read enable signal/RE.

Once a read operation is ended to change the signal RE_EN from "1" to "0", the signal OE_L changes from "1" to "0" one cycle after the system clock SYS_CLK. The I/O control circuit 45 disables the input circuit 43, while enabling the output circuit 44 (time t3).

Thus, in the SR mode, the I/O control circuit 45 enables the output circuit 44 in response to a change in the signal from "1" to "0". This brings the I/O circuit 42 into an "output" mode.

(EDO Mode)

A data read operation in accordance with the EDO mode is started when the read enable signal/RE falls while the state signal C_ST is in the "DATA_IN" state as in the case of the SR mode. In the present example, the EDO mode is asserted when the read mode switching signal RE_SEL is "1 (=High)".

As shown in FIG. 17, when the state signal C_ST is brought into the "DATA_IN" state, the signal RE_EN changes from "0 (=Low)" to "1 (=High)" (time t1). The read enable signal/RE subsequently changes from "1 (=High)" to "0 (=Low)". The flash memory chip 11 outputs data Dout 1 to the I/O line 15. On this occasion, the interface side I/O control circuit 45, shown in FIG. 14, operates as described below.

The mode switching signal RE_SEL is "1". The selector 50 selects a 1 input in accordance with the signal RE_SEL. When not accessed, the signals WE_GT, CE_L, and RE_EN are as follows: "WE_GT=1 (=High)", "CE_L=1 (=High)", and "RE_EN=0 (=Low)". When accessed (that is, in the present example, in the read mode), the signals WE_GT, CE_L, and RE_EN change to the following values: "WE_GT=0 (=Low)", "CE_L=0 (=Low)", and "RE_EN=1 (=High)". Since "WE_GT=0" and "CE_L=0", a NOR gate circuit 54 outputs "1". Since the "output from the NOR gate circuit 54=1" and "RE_EN=1", an AND gate circuit 55 outputs "1". Since "WE_GT=0", "CE_L=0", and "RE_EL=1", an OR gate circuit 52 outputs "1". Since the signal RE_SEL is "1", the OR gate circuit 56 receives the inverted signal RE_SEL to have its output changed in accordance with the output from the OR gate circuit 52. Since the output from the OR gate circuit 52 is currently "1", the OR gate circuit 56 outputs "1". The selector 51 selects a 1 input.

Since the selector 51 selects the 1 input, the signal RE_EN is input to the flip flop circuit 53. The flip flop circuit 53 outputs the input signal in response to the rising edge of the system clock SYS_CLK. The output from the flip flop circuit 53 is the output enable signal OE_L, which becomes "1 (=High)". Since the signal OE_L becomes "1", the I/O control circuit 45 enables the input circuit 43, while disabling the output circuit 44 (time t2).

Thus, in the EDO mode, the I/O control circuit 45 enables the input circuit 43 in response to a change in the signal RE_EN from "0" to "1". This brings the I/O circuit 42 into the "input" mode.

Since the I/O circuit 42 is brought into the "input" mode, the data Dout1 output to the I/O line 15 is input to the data loading circuit 46 via the input circuit 43 as data DT_IN. On this occasion, the data loading circuit 46, shown in FIG. 15, operates as described below.

The selector 60 in the data loading circuit 46 selects a 1 input in accordance with the signal RE_EN. The selection of the 1 input allows the data DT_IN to be input to the flip flop circuit 61.

The selector 62 selects a 1 input in accordance with the signal RE_SEL. The selection of the 1 input allows the inverted clock signal RE_CLK to be input to the flip flop circuit 61 as a clock signal RD_CLK. The flip flop circuit 61 outputs the input data DT_IN as data RE_DT in accordance with the rising edge of the clock signal RD_CLK. The flip flop circuit 61 subsequently outputs the input data DT_IN as data RE_DT every time the clock signal RD_CLK rises.

In the EDO mode, as shown in FIG. 17, the clock signal RD_CLK rises, in contrast to the SR mode, in synchronism with the falling edge of the system clock SYS_CLK. In the EDO mode, as in the case of the SR mode, the read enable signal/RE rises in synchronism with the rising edge of the system clock SYS_CLK. Consequently, in the EDO mode, the data DT_IN is loaded into the buffer 26 in synchronism with the falling edge of the system clock SYS_CLK, the falling edge of the read enable signal/RE, or the falling edges of both system clock SYS_CLK and read enable signal/RE.

Once a read operation is ended to change the signal RE_EN from "1" to "0", the output from the OR gate circuit 52 changes from "1" to "0". This changes the output from the OR gate circuit 56 from "1" to "0". Since the output from the OR gate circuit 52 is currently "0", the OR gate circuit 56 outputs "0". The selector 51 selects a 0 input.

Since the selector 51 selects the 0 input, the output from the flip flop 53 is input to the flip flop circuit 53 itself. That is, the signal OE_L maintains "1".

Thus, in the EDO mode, even after the signal RE_EN changes from "1" to "0", the signal OE_L does not change to "0" but maintains "1". This is because if the signal OE_L is changed from "1" to "0" one cycle after the system clock SYS_CLK following a change in the signal RE_EN from "1" to "0" as in the case of the SR mode, a data conflict may occur on the I/O line 15. For example, in the present example, data Dout4 may conflict output data Din that is provided to the flash memory chip 11 by the card controller chip 12. Therefore, in the present example, even with a change in the signal RE_EN from "1" to "0", the signal OE_L does not change to "0" but maintains "1".

In the EDO mode, the signal OE_L changes from "1" to "0" after the signal CE_L has been enabled (for example, changed from "0" to "1") or after the signal WE_GT has been enabled (for example, changed from "0" to "1"). When at least either the signal CE_L or the signal WE_GT changes to "1", the output from the OR gate circuit 52 changes from "0" to "1". This changes the output from the OR gate circuit 56 from "0" to "1". Since the output from the OR gate circuit 52 is currently "1", the OR gate circuit 56 outputs "1". The selector 51 selects a 1 input.

Since the signal RE_EN is "0" or the output from the NOR gate circuit 54 is "0", the AND gate circuit 55 outputs "0". Since the selector 51 has selected the 1 input, the flip flop circuit 53 outputs the output "0" from the AND gate circuit 55 in response to the rising edge of the system clock SYS_CLK. In other words, when at least either the signal CE_L or the signal WE_GT changes from "0" to "1", the signal OE_L changes from "1" to "0" one cycle after the system clock SYS_CLK. The I/O control circuit 45 disables the input circuit 43, while enabling the output circuit 44 (at the time t3; in FIG. 17, the signal CE_L changes from "0" to "1").

Thus, in the EDO mode, the I/O control circuit 45 enables the output circuit 44 in response to a change in at least either the signal CE_L or the signal WE_GT from "0" to "1". This brings the I/O circuit 42 into the "output" mode.

The signal WE_GT is enabled not only when the signal/WE is enabled, that is, "/WE=0 (=Low)" but also when the signal/CE, CLE, or SLE is enabled. The signal/CE is enabled when for example, "/CE=0 (=Low)". The signal CLE is enabled when for example, "CLE=1 (=High)". The signal ALE is enabled when for example, "ALE=1 (=High)".

Thus, the card controller chip 12 in the present example varies timing control for the I/O line 15 between the first read mode and the second read mode. This enables the card controller 12 to support both the first read mode and the second read mode, in the present example, both the SR mode and the EDO mode.

Specifically, in the SR mode, the I/O control circuit 45 of the card controller chip 12 switches the I/O circuit 42 to the "input" mode when the signal RE_EN is enabled. The I/O control circuit 45 of the card controller chip 12 switches the I/O circuit 42 to the "output" mode when the signal RE_EN is disabled.

In the EDO mode, the I/O control circuit 45 switches the I/O circuit 42 to the "input" mode when the signal RE_EN is enabled, as is the case with the SR mode. However, in contrast to the SR mode, the I/O control circuit 45 switches the I/O circuit 42 to the "output" mode when at least either the signal CE_L or the signal WE_GT is enabled. Thus, in the present example, the flip flop circuit 53 has a feedback path 57 that allows its own output to be fed back to its own input. The flip flop 53 further has a feedback path control circuit 58 which keeps the feedback path 57 active even after the signal RE_EN has been disabled and before a signal different from the signal RE_EN, for example, at least either the signal CE_L or the signal WE_GT, is enabled. When at least either the signal CE_L or the signal WE_GT is enabled, the feedback path control circuit 58 inactivates the feedback path 57.

The feedback path control circuit 58 includes OR gate circuits 52 and 56. The feedback path control circuit 58 keeps the feedback path inactive during the SR mode.

The I/O control circuit 45 in the present example includes the feedback path 57 and the feedback path control circuit 58, which controls the feedback path 57 to support both the SR mode and the EDO mode.

Now, description will be given of example of the switching between the SR mode and the EDO mode.

Figure 18:
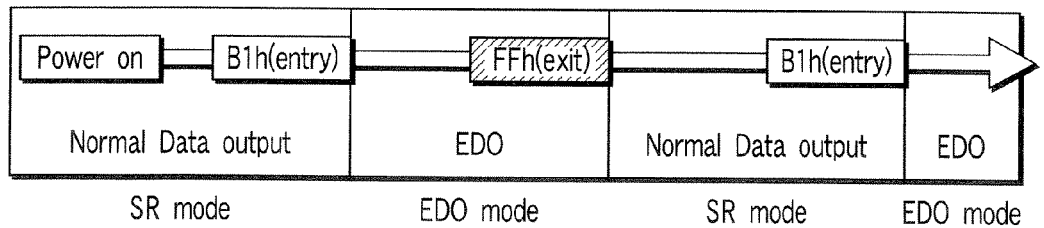
FIG. 18 is a diagram showing an example of mode switching control.

The card controller chip 12 in the present example can control whether to operate the flash memory chip 11 in the SR mode or in the EDO mode. FIG. 18 shows an example of mode switching control.

As shown in FIG. 18, the card controller chip 12 issues an EDO mode entry command "Blh" that enters the second read mode, in the present example, the EDO mode. Upon receiving the command "Blh", the flash memory chip 11 operates in the EDO mode instead of the SR mode. If the command "Blh" is not issued, the flash memory chip 11 operates in the SR mode.

Moreover, the card controller chip 12 can cancel the entered EDO mode. To cancel the EDO mode, the card controller chip 12 issues an EDO mode canceling command "FFh". Upon receiving the command "FFh", the flash memory chip 11 operates in the SR mode instead of the EDO mode.

Further, the flash memory chip 11 in the present example continues to operate in the SR mode after power-on and before receiving the EDO entry command "Blh".

Thus, the card controller chip 12 can control whether to operate the flash memory chip 11 in the SR mode or in the EDO mode. This control may be performed, for example, in accordance with the read mode switching signal RE_SEL.

Further, the flash memory chip 11 shown in the present example can operate both in the SR mode and in the EDO mode. The card controller chip 12 shown in the present example can thus control the flash memory chip 11 that can operate both in the SR mode and in the EDO mode. However, the card controller chip 12 can also control the flash memory chip 11 that supports only the SR mode or the EDO mode.

For example, fixing the read mode switching signal RE_SEL to, for example, "0" allows the card controller chip 12 to assert only the SR mode. In contrast, fixing the read mode switching signal RE_SEL to "1" allows the card controller chip 12 to assert only the EDO mode.

Thus, the card controller chip 12 can control not only the flash memory chip 11 that can operate both in the SR mode and in the EDO mode but also the flash memory chip 11 that supports only the SR mode or the EDO mode.

Now, description will be given of example of inputting of the read mode switching signal RE_SEL.

Figure 19:
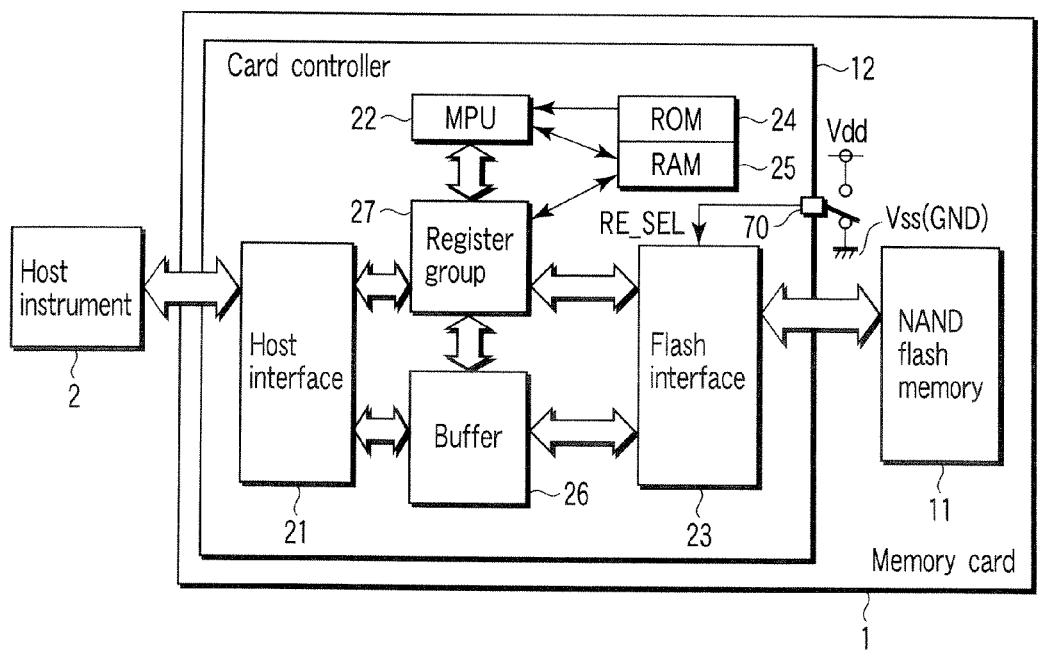
FIG. 19 is a block diagram showing a first example of inputting of a read mode switching signal.
Figure 20:
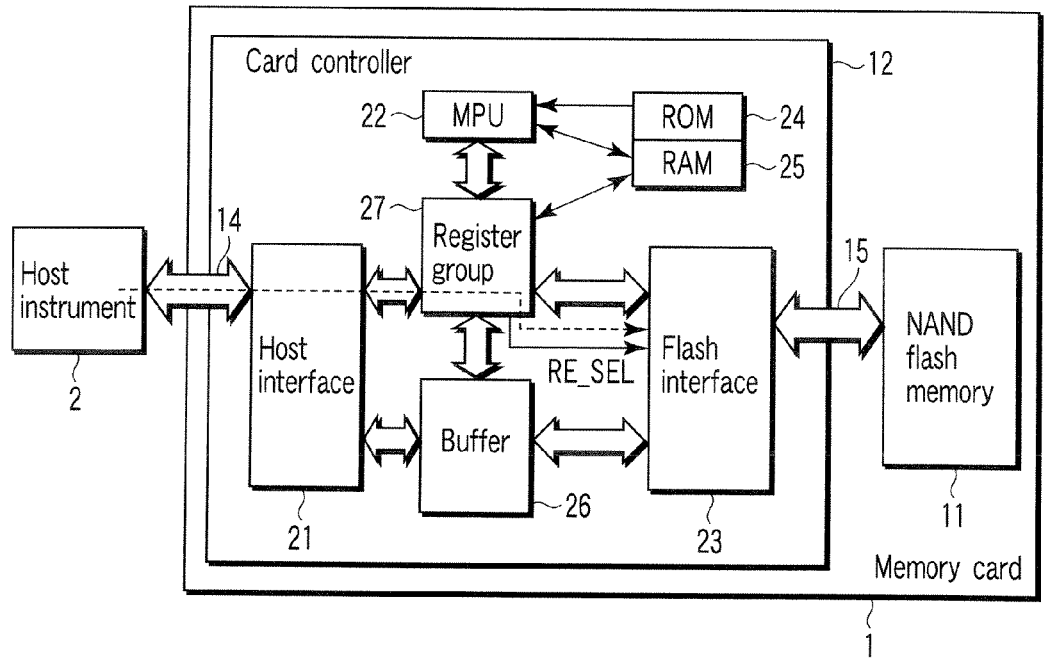
FIG. 20 is a block diagram showing a second example of inputting of the read mode switching signal.
Figure 21:
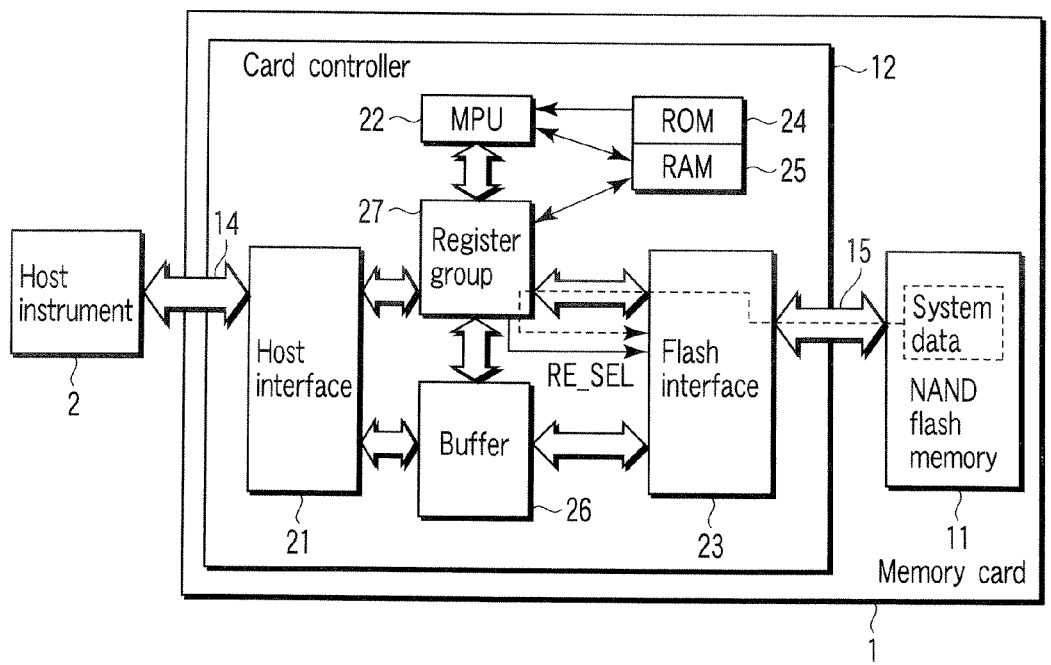
FIG. 21 is a block diagram showing a third example of inputting of the read mode switching signal.

FIGS. 19 to 21 are block diagrams showing examples of inputting of the read mode switching signal RE_SEL.

INPUT EXAMPLE 1

As shown in FIG. 19, in Input Example 1, the card controller chip 12 is provided with an external pin 70 that receives the read mode switching signal RE_SEL. For example, the power supply potential Vdd or the ground potential Vss is input to the external pin 70. For example, inputting the ground potential Vss to the external pin 70 changes the signal RE_SEL to, for example, "0". The SR mode is thus asserted. In contrast, inputting the ground potential Vdd to the external pin 70 changes the signal RE_SEL to, for example, "1". The EDO mode is thus asserted.

Thus, an external source can input the read mode switching signal RE_SEL to the card controller chip 12.

INPUT EXAMPLE 2

As shown in FIG. 20, the read mode switching signal RE_SEL may be provided by the host instrument 2. In this case, for example, 1 bit of the register group 27 is used as an area in which the signal RE_SEL is held. The signal RE_SEL from the host instrument 2 is written to and held in the 1 bit of the register group 27 via the host interface 21. The register group 27 provides the held signal RE_SEL to the flash interface 23.

The host instrument 2 can thus input the read mode switching signal RE_SEL.

INPUT EXAMPLE 3

As shown in FIG. 21, the read mode switching signal RE_SEL may be provided by the flash memory chip 11. As in the case of Input Example 2, for example, 1 bit of the register group 27 is used as an area in which the signal RE_SEL is held. The signal RE_SEL from the flash memory chip 11 is written to and held in the 1 bit of the register group 27 via the flash interface 23. The register group 27 provides the held signal RE_SEL to the flash interface 23.

If the signal RE_SEL is supplied by the flash memory chip 11, then for example, mode switching variable data may be provided in the system data in the flash memory chip 11. The signal RE_SEL is determined in accordance with the variable data.

Thus, the flash memory chip 11 can input the read mode switching signal RE_SEL.

The embodiment of the present invention has been described above. However, the above embodiment is not the only embodiment of the present invention. Various changes may be made to the embodiment without departing from the spirit of the present invention.

For example, in the above embodiment, both the flash memory chip 11 and the card controller chip 12 are mounted in the memory card. However, only the flash memory chip 11 may be mounted in the memory card, with the card controller chip 12 mounted in the host instrument in which the memory card is to be installed.

Further, in the above embodiment, the flash memory and the controller that controls the flash memory comprise the separate chips 11 and 12. However, the flash memory and the controller that controls the flash memory may be mounted on one chip.

The above embodiment includes various levels of inventions. Various levels of inventions can be extracted by appropriately combining a plurality of the components disclosed in the above embodiment.

The above embodiment is based on the example which has the NAND flash memory and its controller. However, the embodiment is not limited to the NAND flash memory and its controller. However, the present embodiment is applicable to flash memories other than the NAND type, such as an AND type and a NOR type, as well as their controllers.

Moreover, the above embodiment is not limited to the memory card containing any of the above flash memories and its controller. The above embodiment is also applicable to any memory system for a semiconductor integrated circuit device, for example, a memory system for a processor or a memory system for a system LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a nonvolatile semiconductor memory;
a controller which controls the nonvolatile semiconductor memory, the controller selecting whether to use the nonvolatile semiconductor memory in a first read mode or in a second read mode having shorter access intervals than the first read mode; and
an I/O line which connects the controller to the nonvolatile semiconductor memory,
wherein the controller comprises:
a system clock generating section which generates a system clock which is used to determine control timing for the controller;
an input circuit to which read data from the nonvolatile semiconductor memory is input through the I/O line;
an output circuit which outputs write data to be written to the nonvolatile semiconductor memory through the I/O line; and
an I/O control circuit which controls the input circuit and the output circuit,
wherein the system clock generating section changes a frequency of the system clock in accordance with a determined read mode so that read modes operate at different system clocks at different clock frequencies,
wherein the controller issues a first control signal in a data read operation, the first control signal performing as a clock for data read from the nonvolatile semiconductor memory,
the nonvolatile semiconductor memory outputs read data to the input circuit, via the I/O line, in synchronization with assertion of the first control signal, and
when the first control signal is negated, the I/O line is set to a high impedance state in the first read mode, and keeps the read data without being set to the high impedance state in the second read mode,
wherein the I/O control circuit generates a second control signal to enable the input circuit and to disable the output circuit based on a third control signal and a fourth control signal, the third control signal enabling the data read operation in the controller, the fourth control signal being a chip enable signal in the controller, and
wherein the I/O control circuit negates the second control signal to disable the input circuit in synchronization with a transition of a logical level of the third control signal in the first read mode, and in synchronization with a transition of a logical level of the fourth control signal in the second read mode, and
the transition of the logical level of the fourth control signal occurs after the transition of the logical level of the third control signal.

2. The system according to claim 1, wherein the controller determines whether to use the nonvolatile semiconductor memory in the first read mode or in the second read mode, in accordance with a read mode switching signal.

3. The system according to claim 2, wherein the controller comprises an external pin which receives the read mode switching signal.

4. The system according to claim 2, wherein the read mode switching signal is provided by a host instrument which uses the nonvolatile semiconductor memory as a recording medium.

5. The system according to claim 4, wherein,
the controller comprises a register, wherein
the register stores the read mode switching signal provided by the host instrument.

6. The system according to claim 2, wherein the read mode switching signal is provided by the nonvolatile semiconductor memory.

7. The system according to claim 6, wherein,
the controller comprises a register, wherein
the register stores the read mode switching signal provided by the host instrument.

8. The system according to claim 2, further comprising a switch circuit which fixes the read mode switching signal to "0" or "1".

9. The system according to claim 2, wherein,
the controller includes a register which stores the read mode switching signal, and
a memory interface which is connectable to the nonvolatile semiconductor memory and which selects whether to use the nonvolatile semiconductor memory in the first read mode or in the second read mode in accordance with the read mode switching signal received from the register.

10. The system according to claim 9, wherein the memory interface receives the read mode switching signal from a host instrument through the register.

11. The system according to claim 9, wherein the memory interface receives the read mode switching signal from the nonvolatile semiconductor memory through the register.

12. The system according to claim 1, wherein the controller includes:
a read data loading circuit which loads the read data input to the input circuit, in response to an edge of the system clock, wherein
the read data loading circuit selects, depending on a determined read mode, whether to load the read data at a rising edge of the system clock or a falling edge of the system clock.

13. The system according to claim 1, wherein,
the controller outputs a second read mode entry command which enters the second read mode and a second read mode canceling command which cancels the entered second read mode, and
upon receiving the second read mode entry command, the nonvolatile semiconductor memory operates in the second read mode instead of the first read mode, and upon receiving the second read mode canceling command, the nonvolatile semiconductor memory operates in the first read mode instead of the second read mode.

14. The system according to claim 1, wherein the nonvolatile semiconductor memory operates in the first read mode after power-on and before receiving a second read mode entry command.

15. The system according to claim 1, wherein the first read mode is a serial read mode, and the second read mode is an extended data out mode.

16. The system according to claim 1, wherein the nonvolatile semiconductor memory is a NAND flash memory.

17. The system according to claim 1, wherein a duty of the system clock in the first read mode is different from a duty of the system clock in the second read mode.

18. The system according to claim 1, wherein the I/O control circuit includes:
a first logical gate which performs a logical operation of the fourth control signal and a fifth control signal, the fifth control signal enabling a data write operation;
a second logical gate which performs a logical operation of the third control signal and an output of the first logical gate;
a first selection circuit which selects the third control signal in the first read mode, and selects an output of the second logical gate in the second read mode;
a flip-flop which receives an input signal and outputs the input signal as the second control signal; and
a second selection circuit which outputs a signal selected by the first selection circuit to the flip-flop as the input signal in the first read mode, and outputs the signal selected by the first selection circuit or the second control signal to the flip-flop as the input signal in accordance with third, fourth, and fifth control signals in the second read mode.

19. A recording medium comprising:
a nonvolatile semiconductor memory;
a controller which controls the nonvolatile semiconductor memory and which selects whether to use the nonvolatile semiconductor memory in a first read mode or in a second read mode having shorter access intervals than the first read mode; and
an I/O line which connects the controller to the nonvolatile semiconductor memory,
wherein the controller includes:
a system clock generating section which generates a system clock which is used to determine control timing for the controller;
an input circuit to which read data from the nonvolatile semiconductor memory is input through the I/O line;
an output circuit which outputs write data to be written to the nonvolatile semiconductor memory through the I/O line; and
an I/O control circuit which controls the input circuit and the output circuit,
wherein the system clock generating section changes a frequency of the system clock in accordance with a determined read mode so that read modes operates at different system clock at different clock frequencies,
wherein the controller issues a first control signal in a data read operation, the first control signal performing as a clock for data read from the nonvolatile semiconductor memory,
the nonvolatile semiconductor memory outputs read data to the input circuit, via the I/O line, in synchronization with assertion of the first control signal, and
when the first control signal is negated, the I/O line is set to a high impedance state in the first read mode, and keeps the read data without being set to the high impedance state in the second read mode,
wherein the I/O control circuit generates a second control signal to enable the input circuit and to disable the output circuit based on a third control signal and a fourth control signal, the third control signal enabling the data read operation in the controller, the fourth control signal being a chip enable signal in the controller, and
wherein the I/O control circuit negates the second control signal to disable the input circuit in synchronization with a transition of a logical level of the third control signal in the first read mode, and in synchronization with a transition of a logical level of the fourth control signal in the second read mode, and
the transition of the logical level of the fourth control signal occurs after the transition of the logical level of the third control signal.

20. A memory controller comprising:
a host interface which is connectable to a host instrument;
a memory interface which is connectable to a semiconductor memory, the memory interface selecting whether to use the semiconductor memory in a first read mode or in a second read mode having shorter access intervals than the first read mode;
a system clock generating section which generates a system clock which is used to determine control timing for the controller;
an input circuit to which read data from the semiconductor memory is input through an I/O line, the I/O line connecting the memory interface to the semiconductor memory;
an output circuit which outputs write data to be written to the semiconductor memory through the I/O line; and
an I/O control circuit which controls the input circuit and the output circuit,
wherein the system clock generating section changes a frequency of the system clock in accordance with a determined read mode,
wherein the memory interface issues a first control signal in a data read operation, the first control signal performing as a clock for data read from the semiconductor memory,
the semiconductor memory outputs read data to the input circuit, via the I/O line, in synchronization with assertion of the first control signal, and
when the first control signal is negated, the I/O line is set to a high impedance state in the first read mode, and keeps the read data without being set to the high impedance state in the second read mode,
wherein the I/O control circuit generates a second control signal to enable the input circuit and to disable the output circuit based on a third control signal and a fourth control signal, the third control signal enabling the data read operation, the fourth control signal being a chip enable signal in the memory controller, and
wherein the I/O control circuit negates the second control signal to disable the input circuit in synchronization with a transition of a logical level of the third control signal in the first read mode, and in synchronization with a transition of a logical level of the fourth control signal in the second read mode, and
the transition of the logical level of the fourth control signal occurs after the transition of the logical level of the third control signal.

21. The controller according to claim 20, further comprising:
a read data loading circuit which loads the read data input to the input circuit, in response to an edge of the system clock, wherein
the read data loading circuit selects, depending on a determined read mode, whether to load the read data at a rising edge of the system clock or a falling edge of the system clock.

* * * * *